United States Patent [19]

Catella et al.

[11] Patent Number: 4,611,090

[45] Date of Patent: Sep. 9, 1986

[54] SEMIRIGID PHOTOVOLTAIC MODULE ASSEMBLY AND STRUCTURAL SUPPORT THEREFOR

[75] Inventors: Gary C. Catella, Chagrin Falls; Ronald C. Cull, Milan; David A. Dilts, Gates Mills; Paul E. Koch; Robert A. Hartman, both of Chagrin Falls, all of Ohio

[73] Assignee: Standard Oil Company, Cleveland, Ohio

[21] Appl. No.: 687,098

[22] Filed: Dec. 28, 1984

[51] Int. Cl.⁴ .......................................... H01L 25/02
[52] U.S. Cl. .................... 136/251; 136/244; 136/258; 136/259
[58] Field of Search ....... 136/244, 245, 251, 258 AM, 136/259; 40/152, 154, 156, 157

[56] References Cited

U.S. PATENT DOCUMENTS

| | | | |
|---|---|---|---|
| 3,181,869 | 5/1965 | Genin et al. | 273/157 |
| 4,132,570 | 1/1979 | Caruso et al. | 136/244 |
| 4,239,555 | 12/1980 | Scharlack et al. | 136/251 |
| 4,392,009 | 7/1983 | Napoli | 136/251 |

Primary Examiner—Aaron Weisstuch
Attorney, Agent, or Firm—Thomas P. Schur; Joseph G. Curatolo; Larry W. Evans

[57] ABSTRACT

A semirigid support member is provided for deploying flexible photovoltaic modules in a manner that imparts a degree of rigidity and permanence to the deployment. The semirigid support members provide lightweight economical means for lending structural support to flexible photovoltaic modules. The support members may be interconnected and additionally connected to a permanent base foundation.

38 Claims, 8 Drawing Figures

SEMIRIGID PHOTOVOLTAIC MODULE ASSEMBLY AND STRUCTURAL SUPPORT THEREFOR

FIELD OF THE INVENTION

The present invention relates to a semirigid photovoltaic module assembly and a structural support member therefor. More specifically, the invention relates to a flexible photovoltaic module and semirigid support means therefor. The support means imparts semirigidity to the photovoltaic module for permanent deployment in the field in a lightweight, versatile, and economic manner. The support means may be fixedly attached to the photovoltaic module in its manufacture or attached to the module in the field.

BACKGROUND OF THE INVENTION

Photovoltaic devices, devices that convert solar radiation directly to electricity, have been developed dramatically in the last 25 years. The majority of the development effort in the photovoltaic area originally was directed towards the development of crystalline photovoltaic devices. Single crystal devices, such as single crystal silicon solar cells, originate as thin wafers cut from a solid cylinder of crystalline silicon. These wafers are very fragile and must be protected from breakage. In many applications, these single crystal photovoltaic devices are intended to be interconnected, either in series or in parallel, and permanently deployed for power generation. It is necessary to encase these photovoltaic devices, either individually or in an array, in a rigid framework such as a metal casing and provide a rigid transparent cover material, such as glass to protect the devices. Such an encasing arrangement generally results in a heavy module assembly wherein the encasing, or support, means contributes disproportionately to the overall weight and cost of the photovoltaic device. The same is true for the development of polycrystalline photovoltaic devices.

More recently, photovoltaic devices have been developed that utilize amorphous materials. These amorphous aaterials, such as those disclosed in U.S. Pat. No. 4,217,374 entitled "Amorphous Semiconductor Equivalent to Crystalline Semiconductors" to Ovshinsky, et al. may be deposited on a flexible substrate material. Such amorphous materials do not share the fragile characteristics of their crystalline and polycrystalline counterparts, and so do not have to be as carefully protected. As an example, U.S. Pat. No. 4,410,558, entitled "Continuous Amorphous Solar Cell Production System" to Izu, et al. describes a method of making laminated flexible amorphous silicon solar cells. Such solar cells may incorporate a thin electrically conductive substrate such as stainless steel, amorphous silicon layers, and a transparent electrically conductive top contact of indium tin oxide, the resultant solar cells having a high degree of flexibility that does not impair the cells' efficiency.

Arrays of solar cells in accordance with U.S. Pat. No. 4,419,530, entitled "Solar Cell and Method of Producing Same" to Nath comprise strips of subcells interconnected in series and/or in parallel. An array of such solar cells may be laminated so as to form a flexible array capable of being rolled or similarly disposed for easy transport, unlike rigid crystalline or semicrystalline solar cell arrays.

When deployed in the field, an amorphous solar cell array does not require a protective glass cover as does crystalline or semicrystalline arrays, and so retains its flexibility. However, for permanent or semipermanent deployment, some degree of rigidity is desirable.

It is well known to fix fragile crystalline and semicrystalline cells in rigid frames so as to protect the individual solar cell and its protective transparent covering. Such support means include metal frames as discussed in U.S. Pat. No. 4,089,705 to Rubin, and fiber reinforced plastic support means as disclosed in U.S. Pat. No. 4,132,570 to Caruso, et al. Caruso, et al. teach a solar cell support made from an electrically non-conductive material having a plurality of interconnected wells in the top surface. each well adaptable to receive one crystalline solar cell. The support is designed to accept a glass top cover. The bottom of the support contains rib stiffeners to impart rigidity to the solar cell module.

What is lacking in the field of photovoltaic devices is a lightweight, semirigid support capable of accepting and retaining a flexible photovoltaic module and imparting a high degree of rigidity to the assembly.

It is therefore one object of this invention to provide a semirigid photovoltaic module assembly.

It is another object of this invention to provide semirigid support means for the deployment of flexible photovoltaic modules.

These and additional objects of the present invention will be evident to one skilled in the art from the following description and drawings, and from the appended claims.

SUMMARY OF THE INVENTION

The present invention relates to a semirigid support member for a flexible photovoltaic module, which support member comprises:
- (a) frame adapted to be in contact with the perimeter of the flexible photovoltaic module;
- (b) an inwardly facing flange extending upward from the frame which overlaps a portion of the flexible photovoltaic module perimeter;
- (c) a skirt depending downward from the frame;
- (d) rib stiffeners integral to the frame and extending inward, which rib stiffeners are adapted to contact the flexible photovoltaic module; and
- (e) means for securing the flexible photovoltaic module to the frame and the rib stiffeners.

The invention also relates to a semirigid photovoltaic module assembly comprising:
- (a) a flexible photovoltaic module;
- (b) a semirigid support member having a frame adapted to be in contact with the perimeter of the flexible photovoltaic module, an inwardly facing flange extending upward from the frame which overlaps a portion of the module perimeter, a skirt depending downward from the frame and rib stiffeners integral to the frame and extending inward and adapted to contact the flexible photovoltaic module; and
- (c) means for attaching the photovoltaic module to the support member.

Preferably the photovoltaic module assembly additionally includes a gasket disposed continuously around the perimeter of the photovoltaic module.

The invention further relates to a semirigid support for an array of flexible photovoltaic modules, which semirigid support comprises:
- (a) individual flexible photovoltaic modules and individual semirigid support members for the modules, each support member having a frame adapted to be in contact with the perimeter of a photovoltaic module, an inwardly facing flange extending upward from the frame which overlaps a portion of the module perimeter, a skirt depending downward from the frame, rib stiffeners integral to the frame and extending inward and adaptive to contact the photovoltaic module, and means for attaching the photovoltaic module to the support member to form a photovoltaic assembly;

(b) means for fixedly attaching individual semirigid support modules to adjacent semirigid support modules to form an array; and (c) means for securing at least one semirigid support member to a base so that the array of flexible photovoltaic modules is displayed in the desired configuration.

DETAILED DESCRIPTION OF THE INVENTION

As used herein, the phrase "flexible photovoltaic module" refers to a photovoltaic device capable of yielding, as by rolling, bending, or flexing, without impairing the cells' performance in any way. Such flexible photovoltaic modules are generally identified by the absence of a rigid substrate material and a rigid top cover, such as glass. As used herein, the phrase "an array of flexible photovoltaic modules" refers to the deployment of more than one flexible photovoltaic module for use in a particular application. The individual modules being of predetermined size, shape, and electrical output, it will often be desirable to combine more than one flexible photovoltaic module for a particular application. It therefore becomes desirable to employ an array of such modules. This invention pertains to module assemblies that enable flexible photovoltaic modules and arrays thereof to be deployed in a semirigid fashion. This is accomplished by the use of a semirigid support member for individual flexible photovoltaic modules.

The flexible photovoltaic modules referred to herein generally comprise amorphous silicon photovoltaic devices. Such amorphous silicon cells may comprise a p-n junction or p-i-n junction cell such as that described in U.S. Pat. No. 4,409,605 to Ovshinsky et al. Amorphous silicon alloys can be deposited in multiple layers over large area substrates to form photovoltaic devices in a high volume, continuous processing system. Such continuous processing systems are disclosed in U.S. Pat. No. 4,400,409, entitled "A Method of Making P-Doped Silicon Films and Devices Made Therefrom"; 4,410,588, entitled "Continuous Amorphous Solar Cell Production System"; and 4,438,723, entitled "Multiple Chamber Deposition and Isolation System and Method". As disclosed in these patents, a flexible substrate may be continuously advanced through a succession of interconnected environmentally protected deposition chambers, wherein each chamber is dedicated to the deposition of a specific semiconductor material. In making a photovoltaic device, for instance, of p-i-n type configurations, the first chamber is dedicated for depositing a p-type semiconductor alloy. The second chamber is dedicated for depositing an intrinsic amorphous semiconductor alloy, and the third chamber is dedicated for depositing an n-type semiconductor alloy. Such amorphous semiconductor materials may be adjusted for various bandgap energies by doping the various p, i, and n layers with dopants such as phosphorus and arsenic to produce an n-type conductivity layer, and boron, aluminum, gallium, and indium to produce a p-type conductivity layer. As an example, U.S. Pat. No. 4,400,409 to Izu, et al. teaches a method of making p-doped silicon films by utilizing previously known p-dopant metal or boron gaseous materials in unique forms and conditions in a glow discharge silicon, preferably hydrogen and flourine compensated, deposition process. It is noted that, as used herein, the term "p-i-n" type refers to any sequence of p and n or p, i, and n semiconductor alloy layers.

There is provided in accordance with this invention a frame having an inwardly facing flange extending upward from the frame, a skirt depending downward from the frame, rib stiffeners integral to the frame and extending inward, and adhesive means for attaching a flexible photovoltaic module to the support member.

The semirigid support member may be composed of any material having the requisite materials strength. The semirigid support may be selected from the group consisting of wood, steel, aluminum, fiber reinforced resin, plasticized concrete, and fused glass microspheres. Preferably, the support member comprises an electrically insulating material having a high strength such as a fiber reinforced polycarbonate. An example of such a polycarbonate material is General Electric FL 930 Resin with foaming agent, a tradename of the General Electric Company.

The frame preferably has the same general configuration as the perimeter of the flexible photovoltaic module, and preferably has a flat surface intended to be in contact with the perimeter of the photovoltaic module. An inwardly disposed flange extending upward from the flat surface of the frame is used to maintain the flexible photovoltaic module in position. A gasket is preferably disposed around the perimeter of the photovoltaic module. The gasket is preferably made from rubber and/or elastomeric materials such as ethylene propylene dienes, silicones, polyurethanes, and plasticized vinyl. The gasket seals the photovoltaic module edges from the external elements as well as providing an easy to handle module, since the flexible photovoltaic module in a laminate form often has sharp edges not suited for handling. The flange need not be continuous around the perimeter of the frame. Preferably, flange portions are disposed in opposing configurations so as to maintain a well-distributed compressive force on the photovoltaic module. When installing a flexible photovoltaic module onto a semirigid support member having oppositely disposed flange portions, the module may be bowed and then flattened onto the support member frame, fitting the gasketed peripheral edge of the module snugly under the flange sections.

The photovoltaic module is secured to the frame by utilizing an adhesive sealant disposed between the frame and the photovoltaic module. Such sealants must have long lasting characteristics and not be adversely effected by environmental conditions. It is expected that flexible photovoltaic modules disposed on semirigid support materials may be deployed for particular applications in excess of 20 years. The adhesive sealant must likewise be capable of enduring and performing for such a period of time. Examples of such adhesive materials suitable for use in the photovoltaic module assemblies of this invention include epoxy resins and silicone adhesives.

The semirigid support member frame further includes a skirt depending downward around the periphery of the frame. This skirt provides structural support to the flexible photovoltaic module and provides the necessary strength to withstand forces perpendicular to the exposed surface of the photovoltaic module. The skirt may have thickened portions for additional support, preferably at the intersections of the frame with the rib stiffeners. Also, spaced thickened portions of the skirt may be utilized for securing support members to other support members in an array or to a base support. The thickened skirt portions may have openings therein so that adjacent support members or a base support may be bolted thereto.

Rib stiffeners are utilized for additional support. The rib stiffeners extend inward from the support member frame and preferably are interconnected near the center of the support member for additional structural integrity. Preferably, the rib stiffeners have a flat surface intended to be in contact with the flexible photovoltaic module. Contact is made permanent by the use of an adhesive material disposed between the rib stiffeners and the flexible module, such as an epoxy resin or a silicone adhesive.

The semirigid support member is seen to cooperatively provide structural integrity to the photovoltaic module assembly in conjunction with the flexible photovoltaic module itself. The flexible photovoltaic module provides a degree of strength to the final assembly, unlike its crystalline or polycrystalline counterparts. Crystalline and polycrystalline photovoltaic devices are fragile and must rely entirely on the structural support member for strength and protection, whereas a flexible photovoltaic module is inherently more resilient and can utilize its own substrate for strength when displayed in an assembly. For this reason a continuous faceplate is not an essential feature of the semirigid support member described herein. The contact surface between the flexible photovoltaic module and the frame and rib stiffeners cooperate with the inherent strength of the flexible module to provide an assembly having the requisite strength for being permanently arrayed.

It may be envisioned however, that as flexible photovoltaic modules become further refined, the module (including the substrate) may become increasingly thinner and may become susceptible to external forces acting thereon. Should the inherent strength of the photovoltaic module be decreased, a semirigid photovoltaic assembly may still be obtained in accordance with this invention either by increasing the number of rib stiffeners in the semirigid support member to compensate therefore, or by additionally providing a faceplate disposed between the frame and rib stiffeners and the flexible photovoltaic module. Such a faceplate may either be integral to the semirigid support member or may be added as a backing to the flexible photovoltaic module. A faceplate may be selected from the group consisting of polyester, polyvinyl chloride, polycarbonate, steel, aluminum, and a carbon loaded acrylonitrile butadiene-styrene resin (ABS).

The following drawings and examples demonstrate the effectiveness of the subject invention. It is to be understood that these drawings and examples are employed for illustrative purposes and are not intended, in any way, to be limitative of the present invention.

DETAILED DESCRIPTION OF THE DRAWINGS

Figure 1:
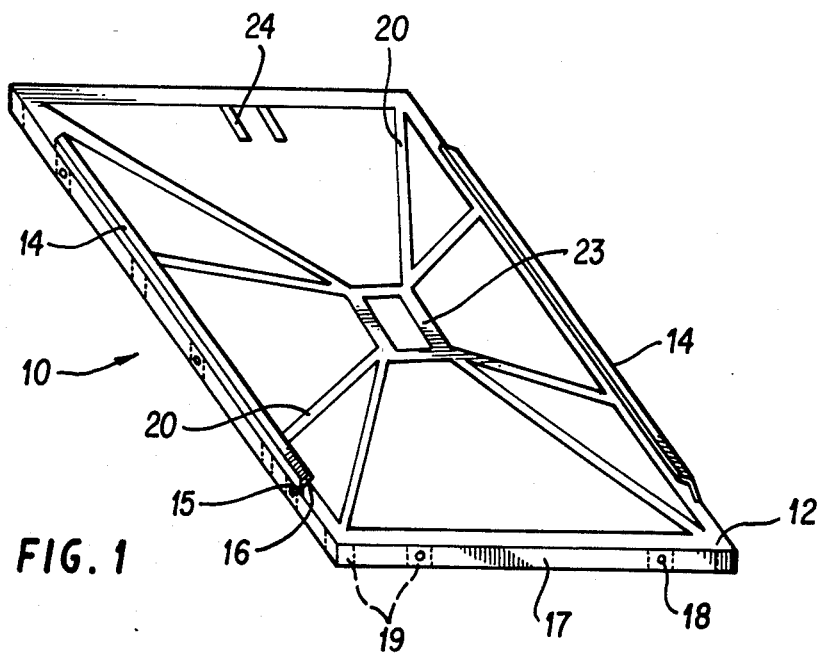
FIG. 1 is a schematic view of the preferred semirigid support member in accordance with the present invention.

Similar features found in the semirigid support members of FIGS. 1-4 have been identified by the same reference numerals.

There is depicted in FIG. 1 a semirigid support member in accordance with the subject invention, generally identified by the reference number 10. This semirigid support member comprises a frame portion 12 preferably having a continuous flat surface. Alternative embodiments may utilize a frame portion having a discontinuous surface or a top surface incorporating a well or grooves for holding and maintaining a sealant therein and for providing additional surface area for bonding.

The frame 12 incorporates an inward facing, upwardly extending flange 14. As shown, flange 14 includes an upwardly extending portion 15 and an inwardly extending portion 16. Upwardly extending portion 15 is designed to be about equal to the thickness of the photovoltaic module or gasketed photovoltaic module to be inserted into the flange. Inwardly extending portion 16 is designed to overlap a portion of the perimeter of the flexible photovoltaic module and to hold that portion in place. Alternatively, flange 14 may comprise one angularly disposed portion to accomplish the desired results. The flange 14 need not be continuous around the frame. Preferably, and as shown in FIG. 1, a flange portion is disposed opposite a second flange portion on the support member such that both flanges cooperate in maintaining the photovoltaic module in place. FIG. 1 utilizes two flanges 14 disposed on opposing sidewalls of a rectangular frame 12. To insert a photovoltaic module onto the frame, it is only necessary to bow the photovoltaic module outward, dispose the module on the frame and flatten the module out forcing the periphery of the photovoltaic module under the opposing flanges.

The semirigid support module also incorporates a skirt 17 depending downward from the frame 12, preferably continuous around the frame, and rib stiffeners 20 extending inward from the frame. The skirt 17 and rib stiffeners 20 provide structural support to the photovoltaic module assembly. Preferably, but not required, the rib stiffeners 20 are interconnected. This interconnection provides a strengthened support member for a deployed photovoltaic module assembly. As shown in FIG. 1, the eight rib stiffeners are interconnected by means of a rectangular structure 23 located at about the center of the frame.

The skirt portion 17 of the semirigid support member preferably employs thickened sections 19 for additional structural support. Such thickened skirt sections 19 preferably occur at those points were the frame 12 and skirt 17 intersect a rib stiffener and also where connection means are to be employed for attaching the support member to adjacent support members or to a base support. At the points where connection means are anticipated, the thickened skirt section 19 may also have openings 18 therein to permit the adjacent attachment of bolts or other fastening means so as to connect the support member to adjacent support members or to a base support.

The support member shown in FIG. 1 also functions cooperatively with the photovoltaic module by providing a rectangular structure 23 therein for acceptance of an electrical junction box. The rectangular structure 23 may include thickened portions for acceptance of screws or bolts for installation of such a junction box. In addition, the support member may incorporate a clamp 24 for alternative electrical connection means. An example of such an alternative electrical connection means is described in a brochure entitled "AMP Solarlok Connector System", Data Sheet 83-17, issued November, 1983.

The semirigid support module depicted in FIG. 1 is seen to provide a high degree of structural support to a flexible photovoltaic module deployed thereon and includes cooperative means for maintaining secure electrical wiring connections between the photovoltaic module and adjacent photovoltaic modules or a current collection means.

Figure 2:
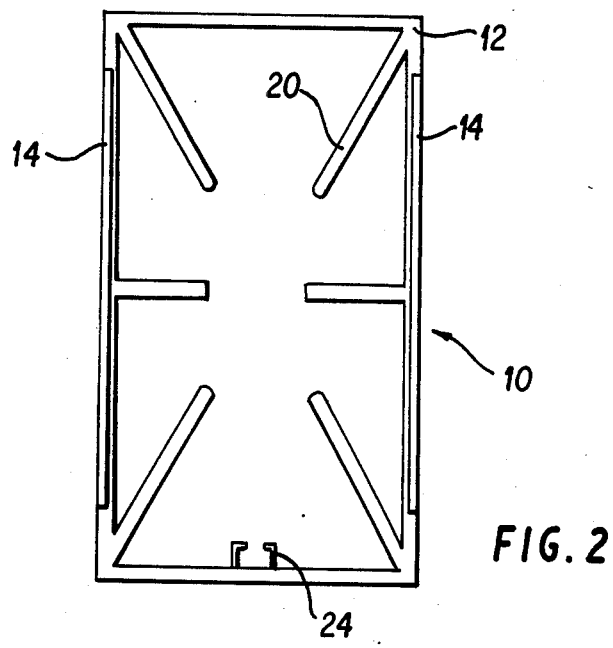
FIG. 2 is a top plan view of an alternative embodiment of the semirigid support member of the present invention.

FIG. 2 shows a top plan view of an alternative embodiment of a semirigid support member in accordance with the present invention. As shown in FIG. 2, rib stiffeners 20 need not be interconnected nor need a means for attaching a conventional junction box be incorporated in the semirigid support members of this invention. The FIG. 2 embodiment incorporates a frame 12 having flanges 14, a skirt 17, and rib stiffeners 20 that extend partially inwards. A photovoltaic module deployed on such a support member would be secured to the frame and to the surface of the rib stiffeners by means of an adhesive, and also held in place by flanges 14.

Figure 3:
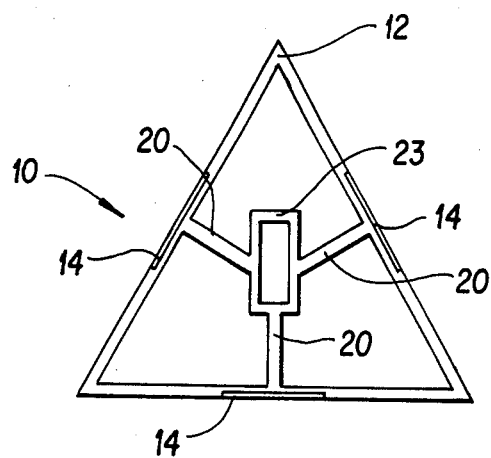
FIG. 3 is a top plan view of yet another embodiment of the semirigid support member of the present invention.

FIG. 3 is a top plan view of yet another embodiment of the semirigid support member of the present invention. In FIG. 3, the frame 12 is seen to be triangular in shape, as contrasted to the rectangular frames displayed in FIGS. 1 and 2. The frame 12 is designed to have a geometry similar to that of the photovoltaic module intended to be deployed thereon, that is, a flexible triangular photovoltaic module. In FIG. 3 each side of the frame is seen to utilize a flange portion 14 and one rib stiffener 20 extending inward toward the center of the support member. The rib stiffeners terminate inwardly at a rectangular structure 23 near the center of the triangular frame where additional means exists for acceptance of an electrical junction box. Thus, it is seen that a semirigid support member in accordance with this invention is intended to make efficient use of materials as are necessary to provide structural support to a flexible photovoltaic module and to cooperate in attachment of electrical interconnects therebetween.

Figure 4:
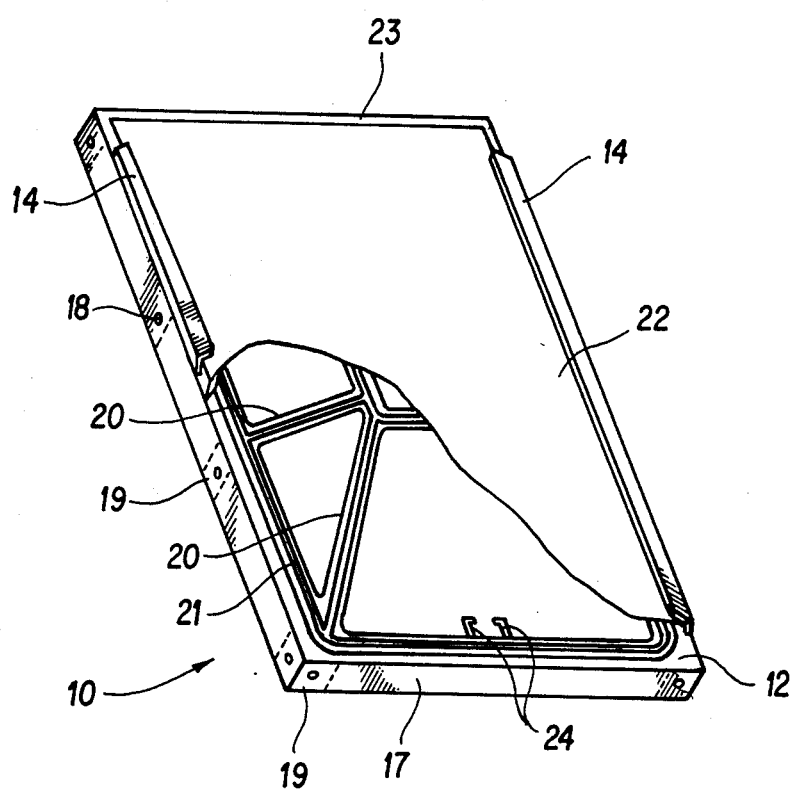
FIG. 4 is a partial schematic view of a photovoltaic module assembly in accordance with this invention.

FIG. 4 is a partial schematic view of a photovoltaic module assembly in accordance with the present invention. There is shown in FIG. 4 the semirigid support member 10 described hereinabove with reference to FIG. 1. The support member incorporates a frame 12, a skirt 17 depending downward therefrom having thickened portions 19 in those areas wherein the frame and skirt intersect rib stiffeners 20 and wherein the support is intended to be attached to adjacent supports or to a base support means. Those areas of the skirt intended for attachment are thickened and have openings 18 therethrough to accept bolts, screws and the like. The support member shown utilizes two flanges 14 on opposing sidewalls of the rectangular frame 12. A flexible photovoltaic module 22 having a gasket 23 around the perimeter thereof is shown in partial cut away view. The module 22 is attached to the frame 12 and to rib stiffeners 20 by means of an adhesive sealant 21 such as an epoxy resin like Scotch-Weld Structural Adhesive 2216, a trademark of the 3M Corporation. Further, the flexible photovoltaic module has an electrical wiring harness (not shown) extending therefrom that is intended to be connected with external wiring in an electrical connection box, not shown that is held in place with containment brackets 24. Such a photovoltaic module assembly is now ready for permanent deployment.

FIGS. 5-8 are schematic views of possible means for deploying the photovoltaic module assemblies as arrays in the field. Similar features found in each of the Figures are identified by the same reference numbers. In FIGS. 5-8 the flexible photovoltaic modules have been omitted to provide a clear understanding of the invention.

Figure 5:
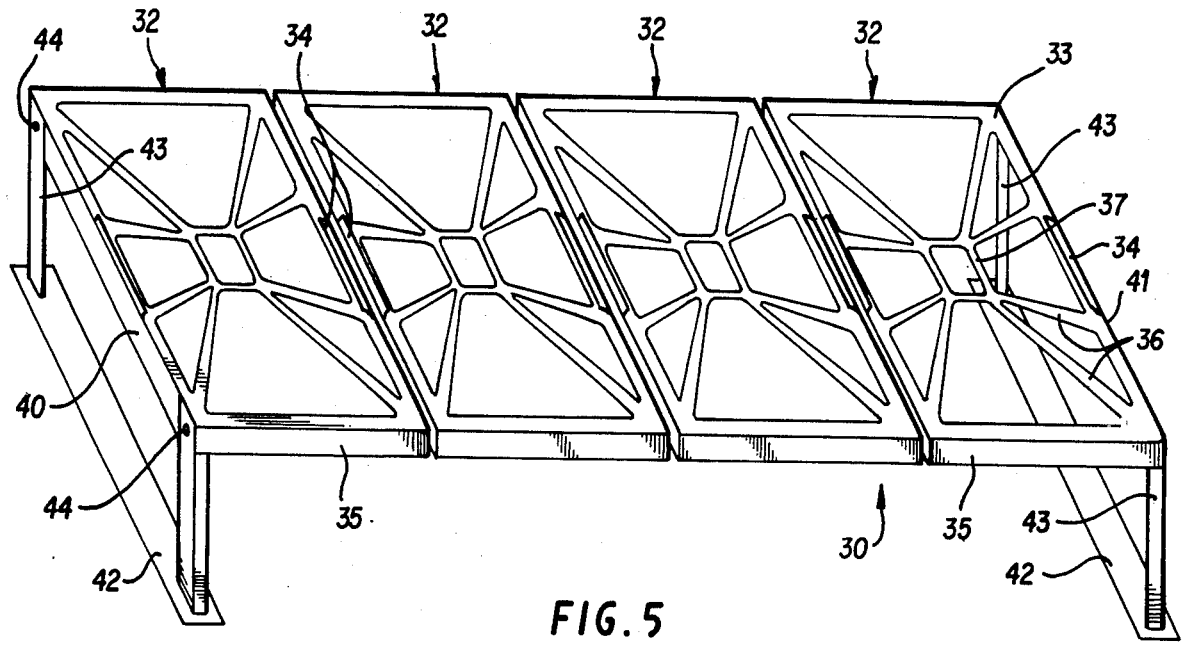
FIG. 5 is a schematic view of an array of photovoltaic modules in accordance with the subject invention.

In FIG. 5 there is shown an array 30 of four semirigid support members 32. Each support member is similar to that depicted in FIG. 1 above, each having a frame 33 incorporating a pair of oppositely disposed flanges 34, a skirt 35, and inwardly extending rib stiffeners 36 that terminate near the center of the frame in a rectangular structure 37 suitable for insertion of an electrical junction box therein. Each interconnected semirigid support member is secured to an adjacent support member with bolts through holes in thickened portions of the skirt 35. The four module array 30 is permanently deployed by attaching the two outer exposed sides of the array, 40 and 41 to a permanent base 42. This is accomplished by securing the array to posts 43 by means of bolts 44 through openings in the thickened portions of the support member skirt 35, which posts are fixedly attached to the permanent base 42. The length of the posts and disposition of the base are predetermined so that the array is deployed in the desired configuration for optimum photovoltaic responsive effectiveness.

Figure 6:
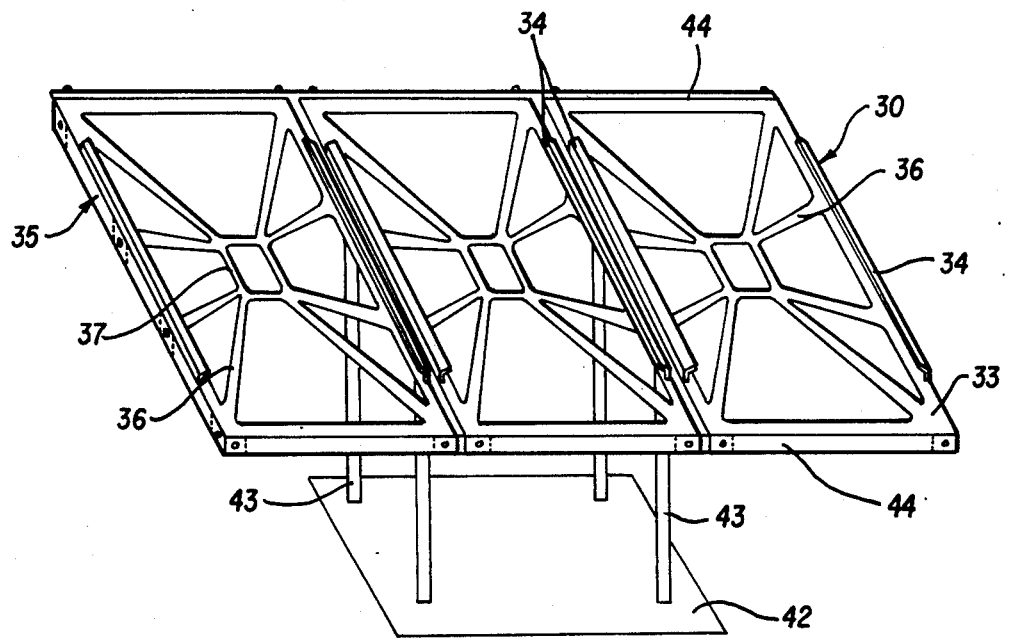
FIG. 6 is a schematic view of an alternative array of photovoltaic modules deployed in accordance with this invention.

FIG. 6 depicts an alternative embodiment of an array of semirigid photovoltaic module assemblies that can be deployed in a permanent manner. Each support member is similar to that depicted in FIGS. 1 and 5 above, having a frame 33 incorporating a pair of oppositely disposed flanges 34, a skirt 35, and inwardly extending rib stiffeners 36 that terminate near the center of the frame in a rectangular structure 37 suitable for insertion of an electrical junction box therein. In FIG. 6 each adjacent semirigid support member is interconnected by fastening means such as bolts extending through holes in the thickened portions of the skirt 35. The three module array 30, shown in FIG. 6, is permanently deployed by disposing support posts 43 between adjacent photovoltaic modules. The posts 43 are in turn attached to a permanent base 42. The length of the post and disposition of the base are prefixed so that the array is deployed in a configuration for optimum photovoltaic responsive effectiveness. As is shown in FIG. 6, thickened portions of the skirt having openings therethrough may be provided along the shortened dimension of the support member and, if desired, a stabilizing bar 44 may be attached thereacross for additional support. A stabilizing bar 44 is shown at the top and bottom of the photovoltaic array 30 in FIG. 6.

Figure 7:
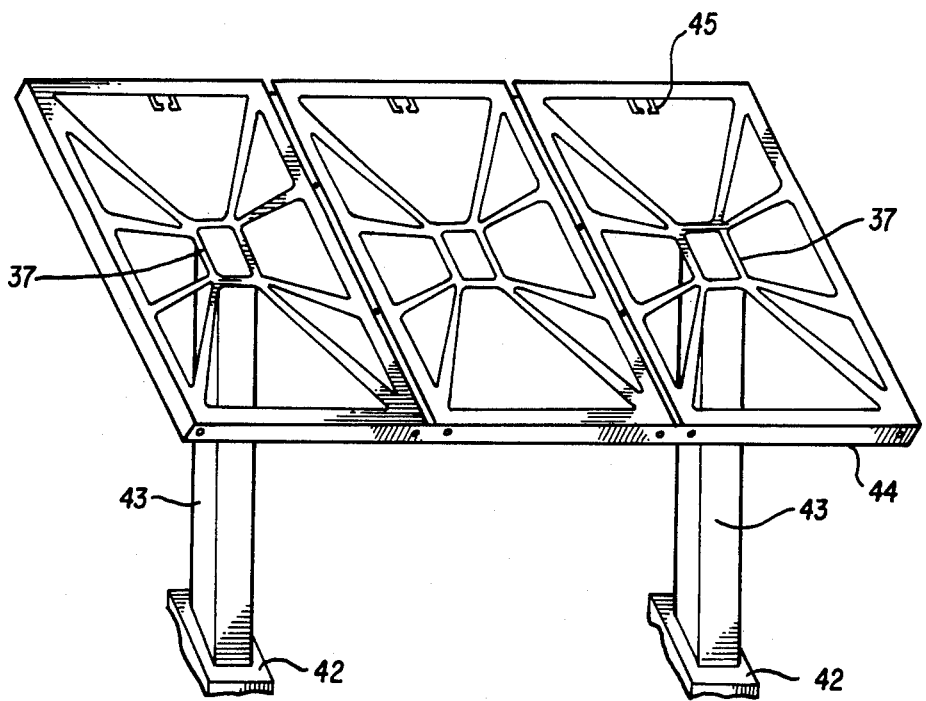
FIG. 7 is a schematic view of yet another alternative array of photovoltaic modules in accordance with this invention.

Still another means for deploying a photovoltaic array in accordance with the present invention is shown in FIG. 7. The three photovoltaic module assemblies depicted in FIG. 7 incorporate semirigid support members similar to the one shown in FIG. 1. In this embodiment, electrical interconnects between the flexible photovoltaic modules and an outside current collector can be made by utilizing a novel junction box, not shown, and a clamp 45. The rectangular structure 37 disposed near the center of the frame is utilized not for a conventional electrical junction box, but for a center mounted support for the photovoltaic array. Posts 43 extend from the rectangular structure 37 in the two outer semirigid support members and are fixedly attached to permanent bases 42. As was shown in FIG. 6, at least one stabilizing bar 44 may be incorporated to provide additional stability to the array.

Figure 8:
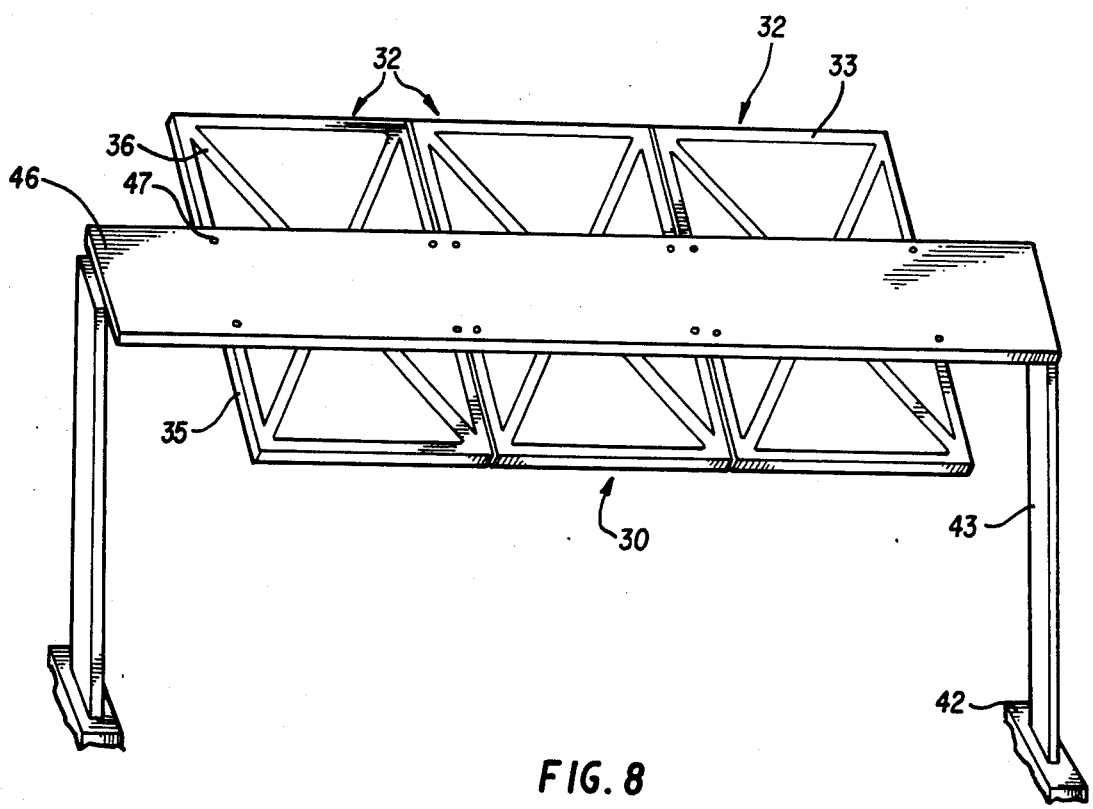
FIG. 8 is still another schematic view of an alternative array of photovoltaic modules in accordance with the present invention.

Another means for deploying a photovoltaic array 30 in accordance with the subject invention is depicted in FIG. 8. The three photovoltaic module support members 32 are similar to that depicted in FIG. 1, having a frame 33 incorporating a pair of oppositely disposed flanges not shown, a skirt 35, and inwardly extending rib stiffeners 36 that terminate near the center of the frame in a rectangular structure not shown suitable for insertion of an electrical junction box therein. A rearview of the photovoltaic array 30 is shown in FIG. 8. In FIG. 8, the adjacent semirigid support members are not interconnected, but rather each member is attached to a common torque bar 46. In the Figure, the support members include means for accepting bolts or screws in thickened skirt areas. Bolts or screws 47 extend through the torque bar 46 and are fastened to the support members 32. This arrangement permits easy removal of any one or more photovoltaic module assembly without disturbing the remaining assemblies.

The torque bar 46 is in turn fastened to a permanent base 42, as with support posts 43. The torque bar may comprise one or more bars made of aluminum, galvanized steel, wood, and other materials obvious to one skilled in the art.

EXAMPLES

The semirigid support members described hereinabove were tested in the following manner to insure their structural support. Two semirigid support members, similar to that depicted in FIG. 1 above, were made from General Electric FL 930 Resin, a tradename of the General Electric Company, and a foaming agent. The polycarbonate support members were bolted together through openings provided in the support member skirt. The support member was then subjected to a uniform pressurized loading of 50 lbs./ft.$^2$ (2.1 kgm/m$^2$) in a free floating load test. The semirigid support member was seen to have about a two-inch (5.1 cm) deflection under these conditions. This is considered comparable to a wind loading on a photovoltaic module attached to such a support member of about 140 miles/hour (225 kilometers/hour).

An array of modules in accordance with the subject invention were also tested for wind loading. Flexible photovoltaic modules were deployed onto four semirigid support members in accordance with the present invention and deployed in a configuration shown in FIG. 5. Each adjacent module was connected to the next by means of two bolts. Structural steel was then used as support poles and were bolted to a fixed foundation. The photovoltaic array was enveloped in an enclosed space which could be pressurized alternately from above and from below the array. Air was directed against the top of the array equivalent to 90 miles per hour winds (145 kilometers/hour) up to a pressure of about 20 lbs/ft$^2$ (0.84 kgm/m$^2$). The air was then allowed to exhaust while an equivalent force was directed against the back of the photovoltaic array. This cycle was continued for 10,000 cycles. After 10,000 cycles, the photovoltaic array was removed from its enclosure and examined. No structural defects were found in the semirigid support members nor did the adhesive sealant that held the flexible photovoltaic modules to the support members exhibit any signs of failure. Thus, the semirigid support member disclosed in this specification is a light weight, economical and effective means for deployment of flexible photovoltaic modules.

In as much as the present invention is subject to many variations. modifications and changes of detail. a number of which have been expressly stated herein, it is intended that all matter described throughout the specification or shown in the accompanying drawings be interpreted as illustrative and not in a limiting sense. It should thus be evident that a device constructed in accordance with the concepts of the present invention and reasonable equivalents thereto will accomplish the objects of the present invention. The scope of the invention shall include all modifications and variations that fall within the scope of the attached claims.

We claim:
1. A semirigid photovoltaic module assembly comprising:
    (a) a flexible photovoltaic module;
    (b) a semirigid support member having a frame adapted to be in contact with the perimeter of the flexible photovoltaic module, an inwardly facing flange extending upward from the frame which overlaps a portion of the module perimeter said flexible photovoltaic module being gripped by said flange, a skirt depending downward from the frame, and rib stiffeners integral to the frame and extending inward and adapted to contact the flexible photovoltaic module; and
    (c) means for attaching the photovoltaic module to the support member.

2. The semirigid photovoltaic module assembly in accordance with claim 1 wherein said flexible photovoltaic module comprises an amorphous silicon photovoltaic module.

3. The semirigid photovoltaic module assembly in accordance with claim 2 wherein said amorphous silicon photovoltaic module comprises a p-i-n structure.

4. Ihe semirigid photovoltaic module assembly in accordance with Claim 1 wherein the semirigid support member comprises an electrically insulating material.

5. The semirigid photovoltaic module assembly in accordance with claim 1 wherein said semirigid support member comprises a fiber reinforced plastic resin.

6. The semirigid photovoltaic module assembly in accordance with claim 1 wherein said semirigid support member comprises a polycarbonate.

7. The semirigid photovoltaic module assembly in accordance with claim 1 wherein said skirt has spaced, thick-walled portions.

8. The semirigid photovoltaic module assembly in accordance with claim 1 wherein said spaced, thick-walled portions of said skirt have openings therethrough.

9. The semirigid photovoltaic module assembly in accordance with claim 1 wherein said rib stiffeners are interconnected.

10. The semirigid photovoltaic module assembly in accordance with claim 1 wherein said support member additionally includes means for accepting an electrical junction box.

11. The semirigid photovoltaic module assembly in accordance with claim 1 wherein said support member additionally includes means for accepting a snap-in electrical junction box.

12. The semirigid photovoltaic module assembly in accordance with claim 1 wherein said inward-facing flange is discontinuous around the frame.

13. The semirigid photovoltaic module assembly in accordance with claim 1 wherein a plurality of flange portions are disposed in opposing configurations around the frame.

14. The semirigid photovoltaic module assembly in accordance with claim 1 wherein said means for attaching the photovoltaic module to the support member comprises an adhesive material disposed between said module and said support member.

15. The semirigid photovoltaic module assembly in accordance with claim 14 wherein said adhesive material is an epoxy resin.

16. The semirigid photovoltaic module assembly in accordance with claim 14 wherein said adhesive material is a silicone.

17. The semirigid photovoltaic module assembly in accordance with claim 1 wherein a gasket is disposed around the periphery of said photovoltaic module.

18. The semirigid photovoltaic module assembly in accordance with claim 17 wherein said gasket material is selected from the group consisting of ethylene propylene dienes, silicones, polyurethanes, and plasticized vinyls.

19. The semirigid photovoltaic module assembly in accordance with claim 18 wherein said gasket material is ethylene propylene diene.

20. The semirigid photovoltaic module assembly in accordance with claim 1 wherein a faceplate is disposed between said flexible photovoltaic module and said semirigid support member.

21. The semirigid photovoltaic module assembly in accordance with claim 20 wherein said faceplate is integral to said semirigid support member.

22. The semirigid photovoltaic module assembly in accordance with claim 20 wherein said faceplate is made from a material selected from the group consisting of polyesters, polyvinyl chloride, polycarbonates, steel, aluminum, and carbon-loaded ABS polymers.

23. The semirigid photovoltaic module assembly in accordance with claim 22 wherein said faceplate material is polyvinyl chloride.

24. A semirigid array of flexible photovoltaic modules, which semirigid array comprises:

(a) individual flexible photovoltaic modules and individual semirigid support members for said modules, each individual support member having a frame adapted to be in contact with the perimeter of a photovoltaic module, an inwardly facing flange extending upward from the frame and which overlaps a portion of the module perimeter, a said flexible photovoltaic module being gripped by said flange, a skirt depending downward from the frame, rib stiffeners integral to the frame and extending inward and adapted to contact the photovoltaic module, and means for attaching the photovoltaic module to the support member to form a photovoltaic assembly;

(b) means for fixedly attaching individual semirigid support members to adjacent semirigid support members to form an array; and (c) means for securing at least one semirigid support member to a base so that the array of flexible photovoltaic modules may be displayed in the desired configuration.

25. The semirigid array in accordance with claim 24 wherein said individual flexible photovoltaic modules comprise amorphous silicon photovoltaic modules.

26. The semirigid array in accordance with claim 24 wherein said semirigid support members comprise an electrically insulating material.

27. The semirigid support in accordance with claim 24 wherein said semirigid support members comprise a polycarbonate.

28. The semirigid array in accordance with claim 24 wherein said skirt has spaced, thick-walled portions.

29. The semirigid array in accordance with claim 28 wherein said spaced, thick-walled portions of said skirt have openings therethrough.

30. The semirigid array in accordance with claim 24 wherein said rib stiffeners are interconnected.

31. The semirigid array in accordance with claim 24 wherein said semirigid support members additionally include means for accepting an electrical junction box.

32. The semirigid array in accordance with claim 24 wherein said inwardly facing flange is discontinuous around the frame.

33. The semirigid array in accordance with claim 24 wherein means for attaching the photovoltaic module to the support member comprises an adhesive material disposed-between said module and said support.

34. The semirigid array in accordance with claim 33 wherein said adhesive material is an epoxy resin.

35. The semirigid array in accordance with claim 24 wherein said means for attaching individual semirigid support modules to adjacent semirigid support modules comprises bolts.

36. The semirigid array in accordance with claim 24 wherein said semirigid support additionally includes at least one stabililizer bar disposed across each photovoltaic assembly and attached thereto.

37. The semirigid array in accordance with claim 24 wherein said means for securing at least one semirigid support member to a base comprises a post attached to said semirigid support member and adapted to be fixedly attached to a permanent base.

38. A semirigid array of flexible photovoltaic modules, which array comprises:

(a) individual flexible photovoltaic modules and individual semirigid support members for said modules, each individual support member having a frame adapted to be in contact with the perimeter of a photovoltaic module, an inwardly facing flange extending upward from the frame which overlaps a portion of the module perimeter, a said flexible photovoltaic module being gripped by said flange, a skirt depending downward from the frame, rib stiffeners integral to the frame and extending inward and adapted to contact the photovoltaic module, and means for attaching the photovoltaic module to the support member to form a photovoltaic assembly;

(b) means fixedly attaching individual semirigid support members to a common torque bar; and (c) means for securing said common torque bar to a base.

* * * * *